United States Patent
Xu et al.

(10) Patent No.: US 10,634,964 B2
(45) Date of Patent: Apr. 28, 2020

(54) CIRCUIT BOARD, CIRCUIT BOARD ASSEMBLY AND LIQUID CRYSTAL DISPLAY DEVICE

(71) Applicant: BOE Technology Group Co., Ltd., Beijing (CN)

(72) Inventors: Jian Xu, Beijing (CN); Hongfei Cheng, Beijing (CN); Yongda Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 238 days.

(21) Appl. No.: 15/300,397

(22) PCT Filed: Nov. 19, 2015

(86) PCT No.: PCT/CN2015/094970
§ 371 (c)(1),
(2) Date: Sep. 29, 2016

(87) PCT Pub. No.: WO2016/201879
PCT Pub. Date: Dec. 22, 2016

(65) Prior Publication Data
US 2017/0184902 A1    Jun. 29, 2017

(30) Foreign Application Priority Data
Jun. 15, 2015 (CN) .......................... 2015 2 0411746

(51) Int. Cl.
*G02F 1/1345* (2006.01)
*H05K 1/02* (2006.01)
(Continued)

(52) U.S. Cl.
CPC ....... *G02F 1/13452* (2013.01); *H05K 1/0269* (2013.01); *H05K 3/0058* (2013.01);
(Continued)

(58) Field of Classification Search
CPC ...................................................... G02F 1/133
See application file for complete search history.

(56) References Cited

U.S. PATENT DOCUMENTS

2003/0107127 A1* 6/2003 Murai ............... G02F 1/136204
257/724
2014/0191930 A1* 7/2014 Okumoto ............... G09G 3/006
345/55

FOREIGN PATENT DOCUMENTS

CN    101060112 A    10/2007
CN    101158756 A    4/2008
(Continued)

OTHER PUBLICATIONS

Translation of KR20070102048.*
Feb. 25, 2016—(WO)—International Search and Written Opinion Report Appn PCT/CN2015/094970 with English Tran.

*Primary Examiner* — Joseph L Williams
*Assistant Examiner* — Jacob R Stern
(74) *Attorney, Agent, or Firm* — Banner & Witcoff, Ltd.

(57) ABSTRACT

A circuit board is provided and the circuit board is used for being attached to a matching board. The circuit board includes a first circuit pattern and an attaching state inspection area, and the attaching state inspection area further includes a third circuit pattern. A liquid crystal display device is further provided, including the circuit board and the matching board, the matching board includes a second circuit pattern matching the circuit board. It is more accurate to judge the attaching state between the circuit board and the matching board by detecting the deformation state of the conductive particles in vacant areas at different locations after the circuit board is attached to the matching board.

19 Claims, 4 Drawing Sheets

(51) Int. Cl.
*H05K 3/00* (2006.01)
*H05K 1/14* (2006.01)
(52) U.S. Cl.
CPC ......... *H05K 1/147* (2013.01); *H05K 2201/04* (2013.01); *H05K 2201/09781* (2013.01); *H05K 2203/166* (2013.01)

(56) References Cited

FOREIGN PATENT DOCUMENTS

| | | | |
|---|---|---|---|
| CN | 101672997 A | | 3/2010 |
| CN | 103268179 A | | 8/2013 |
| CN | 204669721 U | | 9/2015 |
| KR | 20060112521 A | | 11/2006 |
| KR | 20070102048 A | * | 10/2007 |
| WO | WO0126079 | * | 4/2001 |

\* cited by examiner

CIRCUIT BOARD, CIRCUIT BOARD ASSEMBLY AND LIQUID CRYSTAL DISPLAY DEVICE

The application is a U.S. National Phase Entry of International Application No. PCT/CN2015/094970 filed on Nov. 19, 2015, designating the United States of America and claiming priority to Chinese Patent Application No. 201520411746.1, filed on Jun. 15, 2015. The present application claims priority to and the benefit of the above-identified applications and the above-identified applications are incorporated by reference herein in their entirety.

TECHNICAL FIELD

Embodiments of the present invention relate to a circuit board, a circuit board assembly comprising the circuit board, and a liquid crystal display device.

BACKGROUND

There are provided a circuit board and a matching board which attached to each other in the field of electronic circuit. For example, a liquid crystal display device comprises the circuit board and the matching board which attached to each other as mentioned above.

How to accurately judge the attaching state between the circuit board and the matching board is a technical problem to be solved in this field.

SUMMARY

The purpose of embodiments of the present invention is to provide a circuit board and a circuit board assembly comprising the circuit board. The attaching state between a circuit board and a matching board can be accurately judged when the circuit board is attached to the matching board correspondingly.

In order to realize the above purpose, there is provided a circuit board, as an aspect of an embodiment of the present invention, the circuit board is configured to be attached to the matching board. The circuit board comprises a first circuit pattern and an attaching state inspection area, and the attaching state inspection area further comprises a third circuit pattern. In some embodiments, the matching board comprises a second circuit pattern matching the circuit board.

In some embodiments, a height and a material of the first circuit pattern are same as a height and a material of the third circuit pattern.

In some embodiments, the third circuit pattern comprises a plurality of sub-sections distributed in the attaching state inspection area, and the sub sections has no overlapping area with each other in the length direction of the attaching state inspection area.

In some embodiments, the third circuit pattern comprises a plurality of sub-sections distributed in the attaching state inspection area, and one of the sub-sections has overlapping areas with other sub-sections in the length direction of the attaching state inspection area.

In some embodiments, the circuit board comprises two attaching state inspection areas, and the two attaching state inspection areas are respectively positioned on either side of the first circuit pattern.

In some embodiments, the circuit board further includes at least one circuit board alignment mark, and each circuit board alignment mark includes at least two sub-alignment marks provided at an interval.

In some embodiments, the position, in a horizontal direction, of the circuit board alignment mark is in the middle part of the attaching state inspection area. The middle part of the attaching state inspection area here is in the area covering the middle ½ portion of the attaching state inspection area, that is, between the ¼ point and the ¾ point of the attaching state inspection area.

In some embodiments, a height and a material of the circuit board alignment mark are same as a height and a material of the first circuit pattern.

In some embodiments, the circuit board is a part of a display panel.

As another aspect of embodiments of the present invention, there is provided a liquid crystal display device comprising a matching board and a circuit board attached to the matching board, and the circuit board is any of the above mentioned circuit boards provided in the embodiments of the present invention.

In some embodiments, the matching board is a flexible printed circuit board.

Conductive particles are provided in an area, in which the third circuit pattern is not provided, of the attaching state inspection area in the circuit board. In other words, the area not occupied by the third circuit pattern (i.e., the vacant area) in the attaching state inspection area of the circuit board has conductive particles. After the circuit board is attached to the matching board, due to segmented structures in the length direction of the circuit in the third circuit pattern, the pressures applied to the conductive particles in different areas in the length direction of the circuit board become similar to the pressures applied to the conductive particles in the case where the first circuit pattern is attached to the second circuit pattern. Therefore, it can be more accurate to judge the attaching state between the circuit board and the matching board by detecting the deformation state of the conductive particles in the vacant area(s).

BRIEF DESCRIPTION OF THE DRAWINGS

In order to clearly illustrate the technical solution of the embodiments of the invention, the drawings of the embodiments will be briefly described in the following; it is obvious that the drawings in the description are only related to some embodiments of the invention and thus are not limitative of the invention.

REFERENCE SIGNS

1—matching board; 11—second circuit pattern; 12—matching alignment mark; 2—circuit board; 21—first circuit pattern; 22—circuit board alignment mark; 23—attaching state inspection area; 22a—sub-alignment mark; 22b—sub-alignment mark; 23a—third circuit pattern; 23b—vacant area.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
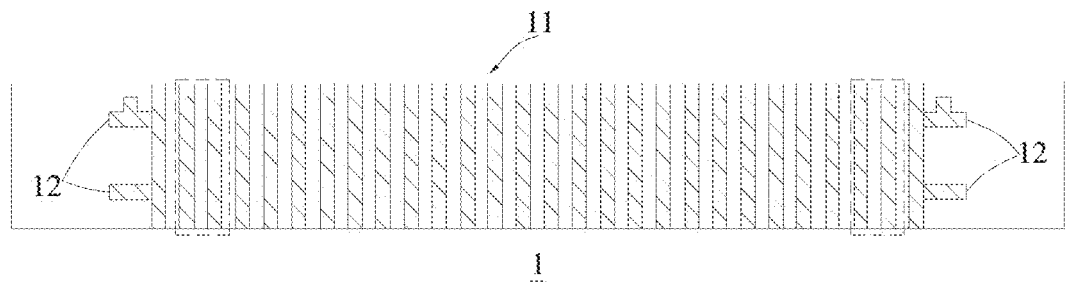
FIG. 1 is a schematic view of a matching board.
Figure 2:
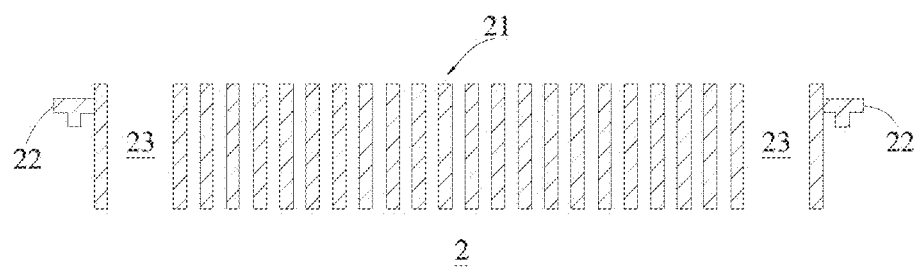
FIG. 2 is a schematic view of a circuit board.

FIG. 2 shows a circuit board 2, which is an external circuit pad area (PAD) provided at the edge of an array substrate in a liquid crystal display panel. A matching board 1 illustrated by FIG. 1 is a flexible printed circuit board (FPC), which can be attached to the circuit board 2 as illustrated by FIG. 2. The matching board 1 and the circuit board 2 are electrically connected and attached with each other via conductive particle adhesive.

Generally, the circuit board 2 comprises a first circuit pattern 21 and an attaching state inspection area, conductive particles are distributed in the attaching state inspection area; accordingly, the matching board 1 includes a second circuit pattern 11 corresponding to the circuit board 2. The shape of the second circuit pattern 11 is the same as the shape of the first circuit pattern 21, that is, they have the same circuit structure. The second circuit pattern of the matching board 1 contacts the conductive particles when the circuit board 2 is attached to the matching board 1 by means of a matching board alignment mark 12 and a circuit board alignment mark 22. The attaching state between the matching board 1 and the circuit board 2 is judged or determined by observing the deformation situation of the conductive particles in the attaching state inspection area 23.

The pressure applied to the matching board 1 and the circuit board 2 by a pressing head for attaching the matching board 1 to the circuit board 2 is a predetermined pressure that can guarantee that all conductive particles in the length direction of the circuit between the first circuit pattern 21 and the second circuit pattern have reached a state of being flattened to have cracks due to pressing (hereinafter flattened state). Because of the height difference between the attaching state inspection area and an adjacent circuit pattern along the length direction of the circuit, the attaching state inspection area 23 has a larger space to contain the conductive particles, and it cannot be guaranteed that the conductive particles in the length direction of the entire circuit board in the attaching state inspection area 23 are all in the flattened state. Therefore, the detected flattened state at a certain position in the length direction deviates from the real state.

Figure 9:
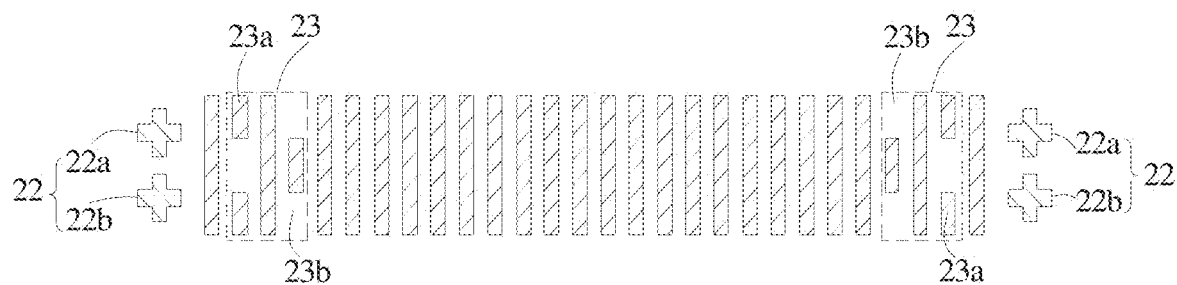
FIG. 9 is a schematic view of an example of the circuit board provided by an embodiment of the present invention.
Figure 10:
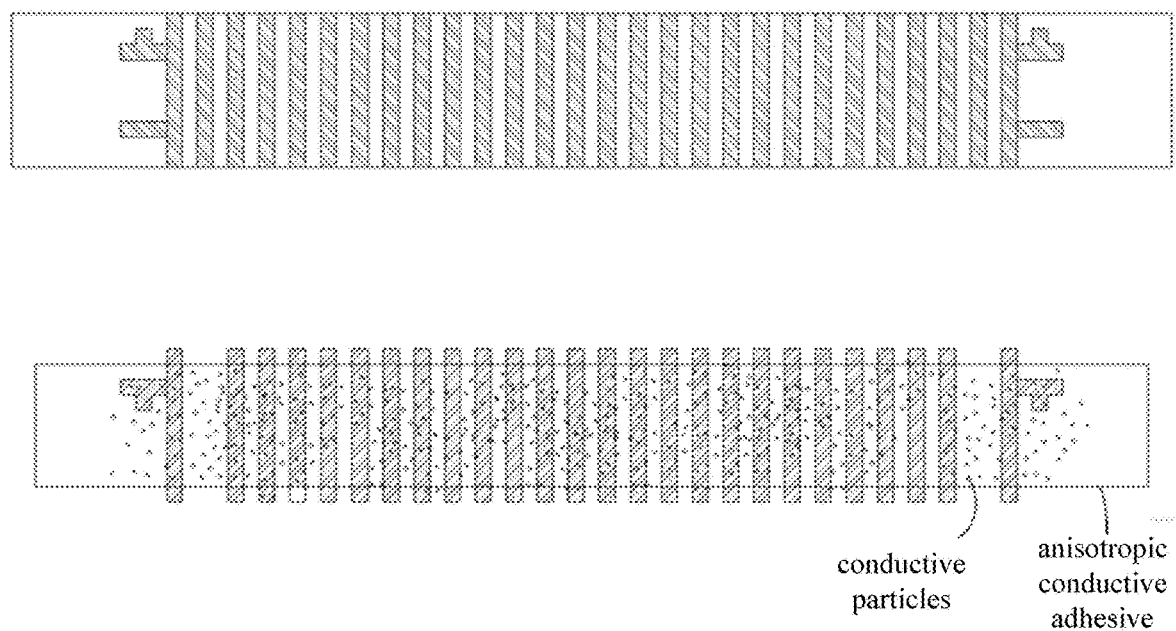
FIG. 10 is the schematic view of the matching board illustrated by FIG. 1 and the circuit board illustrated by FIG. 2 before they are attached to each other.

In order to explain the situation of the conductive particles in the attaching state between the matching board 1 as illustrated by FIG. 1 and the circuit board 2 as illustrated by FIG. 2, FIG. 10 shows the matching board and the circuit board before attaching in which the circuit board is covered by a layer of anisotropic conductive adhesive and the conductive adhesive comprises conductive particles therein. For the sake of simplicity, the conductive adhesive and the conductive particles are not shown in FIGS. 1-9. It should be understood that the conductive particles will lose the conductive effect if they are broken or fractured due to pressing while have conductive characteristics in the case of the normal flattened state.

Figure 11:
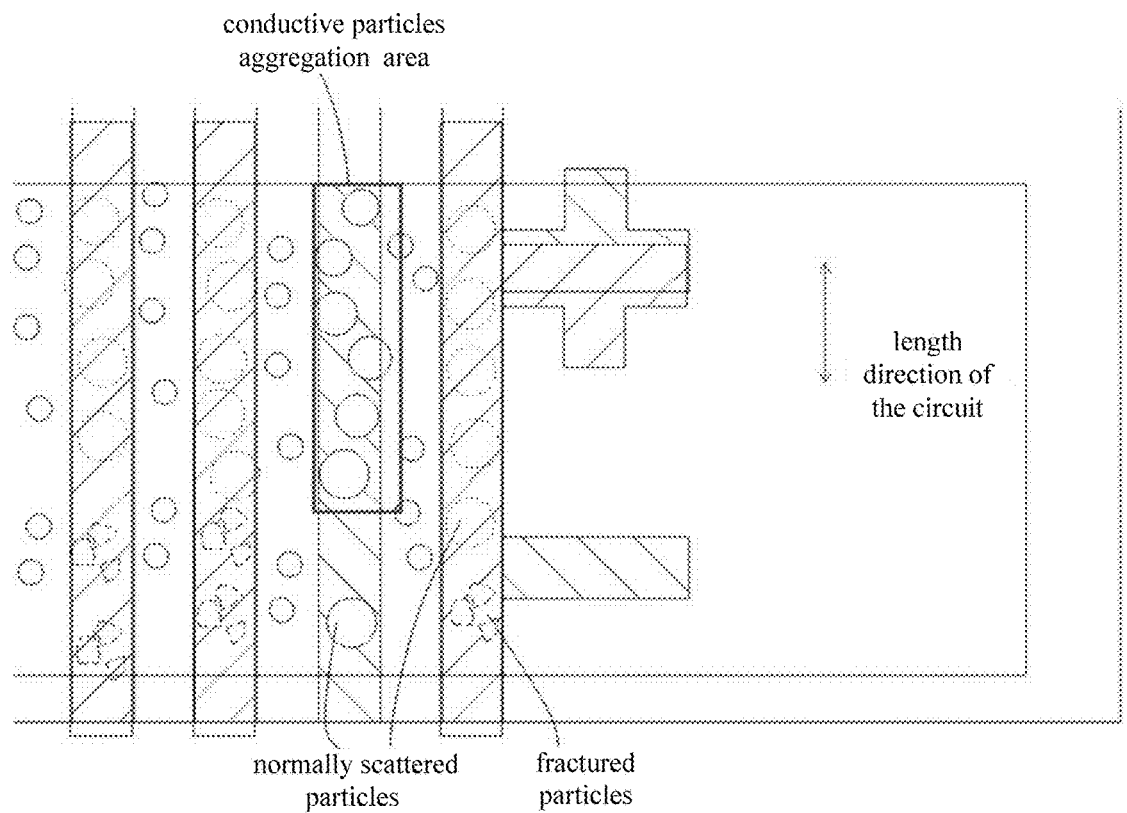
FIG. 11 is an enlarged drawing of the detection area in the case the circuit board and the matching board illustrated by FIG. 10 have been attached to each other.

FIG. 11 is an enlarged drawing of the right detection area in an attaching situation of the circuit board and the matching board as illustrated by FIG. 10. In the process of the matching board and the circuit board being pressed to each other as illustrated by FIG. 10, when the pressure applied from the lower side is larger, the space in the length direction of the circuit of the detection area becomes larger without blocking. The conductive particles move to the side of the lower applied pressure, and the upper side forms an area that the conductive particles aggregate; at this time, the particles on the lower side of the detection area are normally flattened to have cracks. But the conductive particles in the non-detection area of the circuit cannot move because of the pressure of the upper and lower side of the circuit, and in result, the force applied to these conductive particles is larger than that applied to the conductive particles in the detection area, and there may be fractured particles which lose conductive effect. If such fractured particles increase, the circuit may not work normally. In this case, the checked press-close state at a certain position in the direction of the length is more deviated from the real state as illustrated by FIG. 11, for example the particles in the normal flattened state on the lower side of the detection area cannot reflect the fractured particles at the corresponding lower position of the first circuit pattern of the circuit board (or the second circuit pattern of the matching board).

Figure 5:
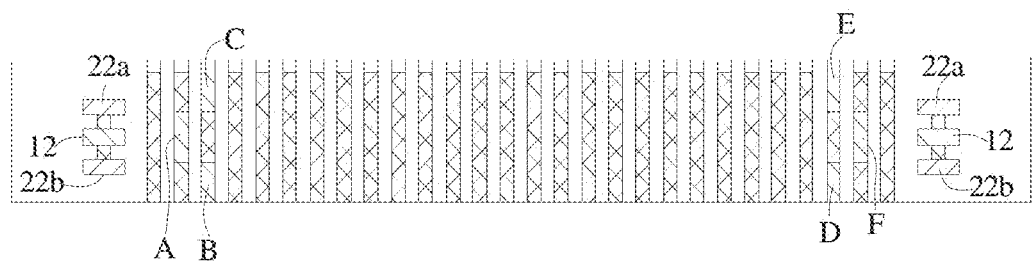
FIG. 5 is a schematic view of a circuit board assembly formed by properly aligning the circuit board illustrated by FIG. 3 and the matching board illustrated by FIG. 4.
Figure 12:
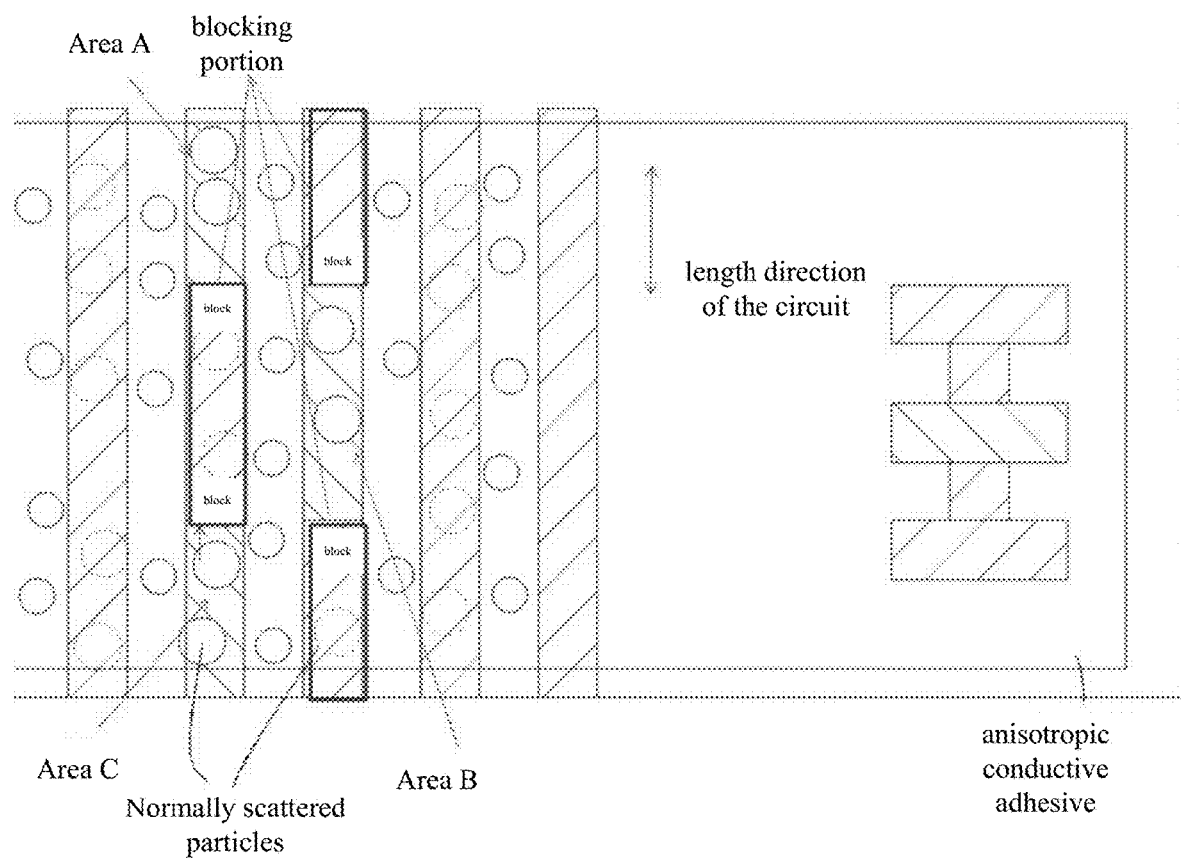
FIG. 12 is an enlarge drawing of the detection area at an attachment situation illustrated by FIG. 5.

FIG. 12 is an enlarged drawing of the right detection area of the attaching state as illustrated by FIG. 5. As shown in FIG. 12, a third circuit pattern disposed on the circuit board makes the space of the detection area become smaller. When the particles are under the action of pressure, each of areas comprises a blocking portion, thus the particles can only be held in the corresponding areas. Thus, the pressure applied to the particles is closer to the pressure of the conductive particles in the circuit area. For example, as shown in FIG. 12, the conductive particles in the upper and lower part of the detection area are blocked by the third circuit located in the middle of the detection area, the conductive particles in the middle part of the detection area are blocked by the third circuit located in the upper and lower of the detection area, which renders the conductive particles in the A area, B area and C area respectively and truly reflect the attaching state of the matching board and the circuit board in the upper, middle and lower parts in the length direction of the circuit in the first circuit pattern and the second circuit pattern.

Figure 3:
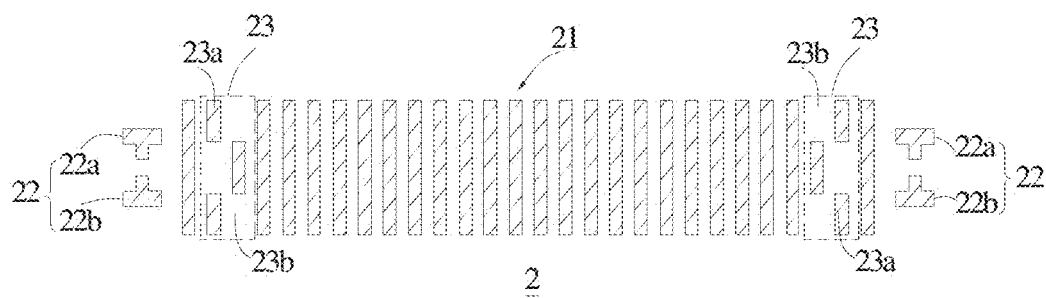
FIG. 3 is a schematic view of an example of the circuit board provided by an embodiment of the present invention.
Figure 4:
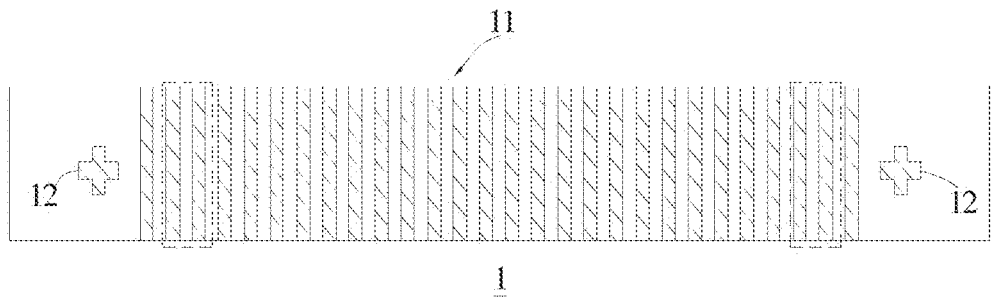
FIG. 4 is a schematic view of a matching board that matches the circuit board illustrated by FIG. 3.
Figure 8:
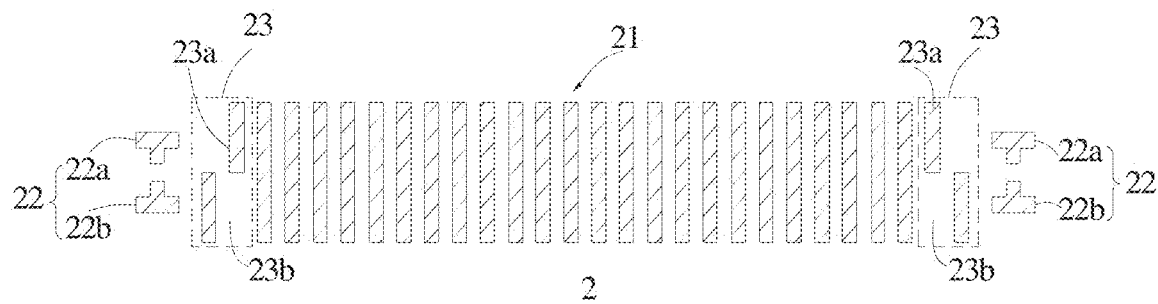
FIG. 8 is a schematic view of an example of the circuit board provided by an embodiment of the present invention.

As shown in FIG. 3, FIG. 8 and FIG. 9, an embodiment of the present invention provides a circuit board 2, the circuit board 2 is configured to attach to a matching board 1 (as shown in FIG. 4) to be attached. The circuit board 2 comprises a first circuit pattern 21 and an attaching state inspection area 23, the matching board 1 comprises a second circuit pattern 11 that matches the circuit board 1, and the attaching state inspection area further comprises a third circuit pattern 23a.

As described above, the second circuit pattern 11 in the matching board 1 matches the circuit board 2, therefore, the second circuit pattern 11 comprises the portion matching the first circuit pattern 21 and the portion matching the third circuit pattern 23a in the attaching state inspection area. In order to facilitate the description, the portion in the second circuit pattern 11 matching the first circuit pattern is referred to as a matching pattern, the shape of the matching pattern is the same as that of the first circuit pattern 21 disposed in the circuit board 2, that is, the matching pattern has the same circuit structure as the first circuit pattern. Accordingly, the portion of the second circuit pattern matching with the attaching state inspection area is referred to as a detection pattern (in FIG. 4, the slash part filled in a dashed frame is the detection pattern). The matching pattern in the matching board 2 is attached to the first circuit pattern 21 in the circuit board 2, and the portion of the detection pattern in the matching board 1 is attached to the third circuit pattern in the circuit board 2, when the circuit board 2 is attached to the matching board 1.

The partial area (i.e. the vacant area 23b) of the attaching state inspection area 23 in the circuit board 2, in which the third circuit pattern 23a is provided, has conductive particles distributed therein. Those skilled in the art should understand that the function of the conductive particles is used for electrically conductive connection between the circuit of the first circuit pattern 21 in the circuit board 2 and the circuit of the second circuit pattern in the matching board 1 after they attached to each other. Because the third circuit pattern 23a has a plurality of sub-sections, a portion of the detection pattern is attached to the third circuit pattern 23a while the rest portion of the detection pattern is attached to the conductive particles in the vacant area 23b when the circuit board 2 is attached to the matching board 1. In this case, segmented structures in the length direction of the circuit in the third circuit pattern 23a make the pressures applied to the conductive particles in different areas in the length direction of the circuit board similar to the pressures of the conductive particles upon the first circuit pattern 21 being attached to the second circuit pattern 11. Therefore, it can be more accurate to judge the attaching state between the circuit board 2 and the matching board 1 by detecting the deformation state of the conductive particles in the vacant area 23b.

In the embodiment of the present invention, the specific structure of the third circuit pattern 23a is not specially restricted, and the structure of the third circuit pattern 23a can be determined according to the structure of the matching pattern.

The third circuit pattern comprises a plurality of sub-sections distributed in the attaching state inspection area, and the sub-sections have no overlapping area with each other in the length direction of the attaching state inspection area. For example, the shape of the third circuit pattern 23a as illustrated by FIG. 3 comprises three sub-sections in the case where the matching pattern comprises two parallel strip electrodes. One sub-section is formed as an upper section of the strip electrode, one sub-section is formed as an intermediate section of the strip electrode, and one sub-section is formed as the lower section of the strip electrode. There is no overlapping area among the three sections in the length direction. Alternatively, the third circuit pattern 23a as illustrated by FIG. 8 includes two sub-sections. One sub-section is the lower part of the strip electrode while the other sub-section is the upper part of the strip electrode, and the two sub-sections have no overlapping area therebetween in the length direction. It is necessary to explain that "no overlap in the length direction with each other" refers to the case that the sub-sections are projected to the strip electrodes, and the projections of the sub-sections on the strip electrode are not overlapped.

The third circuit pattern comprises a plurality of sub-sections distributed in the attaching state inspection area; one sub-section has overlapping areas with the other sub-sections in the length direction of the attaching state inspection area. For example, the shape of the third circuit pattern 23a as illustrated by FIG. 9 comprises four sub-sections in the case that the matching pattern comprises three parallel strip electrodes. One sub-section is formed as an upper section of the strip electrode, one sub-section is formed as a lower section of the strip electrode, one sub-section has the same shape as the strip electrode, and one sub-section is formed as an intermediate section of the strip electrode. The sub-section with the same shape as the strip electrode is located in middle of the attaching state inspection area 23, and the rest sections are respectively positioned on either side of the sub-section with the same shape as the strip electrode. The sub-sections on the two sides can produce projections on the sub-section located in the middle of the attaching state inspection area, therefore, the sub-section located in the middle and the sub-sections positioned on either side of the sub-section have overlapping area in the length direction of the attaching state inspection area therebetween.

Here, the "the length direction of the attaching state inspection area" mentioned herein refers to the upper and lower direction of the drawings.

In the embodiments of the present invention, the setting mode of the third circuit pattern 23a is not specially restricted, and the third circuit pattern 23a can be formed after the first circuit pattern 21 is formed. In order to simplify the manufacturing process, in some embodiments, the first circuit pattern 21 and the third circuit pattern 23a can be formed in the same patterning process, so that the height and material of the third circuit pattern 23a is identical to the first circuit pattern 21.

The circuit board 2 can be provided with one attaching state inspection area 23 or two attaching state inspection areas 23. When the circuit board 2 is provided with one attaching state inspection area 23, correspondingly, one detection pattern is also provided on the matching board 1; when the circuit board 2 is provided with two attaching state inspection areas 23, correspondingly, two detection patterns are also provided on the matching board 1.

In some embodiments, the circuit board 2 is provided with two attaching state inspection areas 23, so that it is more accurate to judge the attaching state between the circuit board 2 and the matching board 1. In order not to interfere with the normal operation of the circuit pattern of the first circuit FIG. 21, the two attaching state inspection areas 23 can be respectively arranged on either side of the first circuit pattern 21 in some embodiments.

In order to ensure that the circuit board 2 and the matching board 1 can be accurately aligned to each other, the circuit board alignment mark and the matching board alignment mark are respectively arranged on the circuit board 2 and the matching board 1. The circuit board 2 and the matching board 1 are first aligned with the help of the circuit board alignment mark on the circuit board 2 and the matching board alignment mark on the matching board 1 before the circuit board 2 is attached to the matching board 1.

In the embodiments of the present invention, the specific shape of the circuit board alignment mark is not specially restricted. For example, the circuit board alignment mark disposed on the circuit board provided by the embodiment in the present invention can be the same as the circuit board alignment mark 22 disposed on the circuit board as illustrated by FIG. 2, correspondingly, the alignment mark on the matching board 1 can be the same as the matching board alignment mark 12 as illustrated by FIG. 1.

As a preferred embodiment of the present invention, the circuit board 2 further comprises at least one circuit board alignment mark 22 and each of the circuit board alignment mark 22 includes at least two sub-alignment marks arranged at an interval. The two sub-alignment marks are sub-alignment mark 22a and sub-alignment mark 22b respectively as shown in FIG. 3, FIG. 8 and FIG. 9. The matching board alignment mark 12 on the matching board 1 is matched with the circuit board alignment mark 22 on the circuit board 2. The horizontal part formed in the matching board alignment mark 12 matches the interval between the sub-alignment mark 22a and the sub-alignment mark 22b. The width of the horizontal part is the same as the width of the interval between the sub-alignment mark 22a and the sub-alignment mark 22b.

As a specific example in the present invention, in one circuit board alignment mark 22, the sub-alignment mark 22a is formed in the shape of "T" and the sub-alignment mark 22b is formed in the shape of inverted "T." Alternately, in one circuit board alignment mark 22, the sub-alignment mark 22a and the sub-alignment mark 22b are both formed in the shape of "+"; correspondingly, the matching board alignment mark 12 can be formed in the shape of "+" in the matching board 1.

FIG. 5 shows the correct alignment situation between the circuit board 2 as illustrated by FIG. 3 and the matching board 1 as illustrated by FIG. 4. In this case, the horizontal part of the matching board alignment mark 12 is located in the interval between the sub-alignment mark 22a and the sub-alignment mark 22b. The areas A, B, C, D, E and F are all the areas corresponding to the vacant area 23b in the circuit board 2. It can be judged whether the circuit board 2 is properly attached or not properly attached to the matching board 1 by observing the state of the conductive particles in the areas A, B, C, D, E and F.

Figure 6:
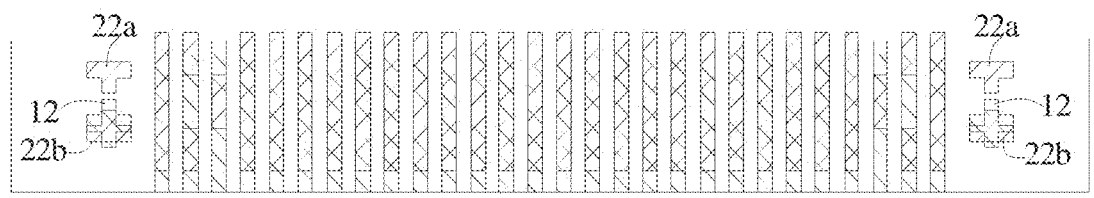
FIG. 6 is a schematic view of a condition of misalignment between the circuit board illustrated by FIG. 3 from the matching board illustrated by FIG. 4.

FIG. 6 shows a situation of misalignment between the circuit board 2 and the matching board 1. It can be known that the position of the circuit board 2 is too close to the upper side by observing the state of the interval in the circuit board alignment mark 22. At this point, the quality of the attaching state can be determined by observing the state of the conductive particles in the upper part of the attaching state inspection area.

Figure 7:
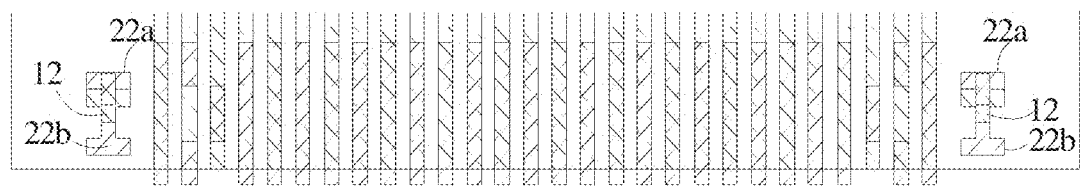
FIG. 7 is a schematic view of a condition of misalignment between the circuit board illustrated by FIG. 3 and from matching board illustrated by FIG. 4.

FIG. 7 shows another situation of misalignment between the circuit board 2 and the matching board 1. It can be known that the position of the circuit board 2 is too close to the lower side by observing the state of the interval in the circuit board alignment mark 22. At this point, the quality of the attaching state can be determined by observing the state of the conductive particles in the lower part of the attaching state inspection area.

Thus it may be known, when a plurality of sub-sections are disposed in the third circuit pattern, the inspection of the attaching state can be conducted through the sub-sections even if the circuit board and the matching board are not exactly aligned in the length direction (i.e., the left and right direction illustrated in FIG. 6 and FIG. 7) of the circuit board 2. Also, when the circuit board alignment mark 22 includes two sub-alignment marks, it can be judged whether the circuit board is properly attached or not properly attached to the matching board 1 at a correct position only by observing whether the interval between the sub-alignment marks is or not filled by the horizontal part or other part of the matching board alignment mark in the matching board 1, without complicated measurement, thus the attached process is simplified, and the time cost is reduced.

The circuit board alignment mark can also play a role in leveling in addition to alignment, and further ensure that the detection pattern is not in a floating state.

As a specific embodiment in the present invention, the position, in the horizontal direction, of the circuit board alignment mark is entirely in the middle part of the attached inspection area in some embodiments.

The circuit board alignment mark can be formed after the first circuit pattern is formed, and the circuit board alignment mark also can be formed at the same time when the first circuit pattern is formed. In order to simplify the manufacturing process, the circuit board alignment mark is formed at the same time when the first circuit pattern is formed in some embodiments, so that the height and material of the circuit board alignment mark is identical to those in the first circuit pattern.

In some embodiments, the circuit board 2 provided by the embodiment of the present invention can be a part of a display panel. For example, the circuit board 2 can be referred to an external circuit pad area at the edge of the array substrate of the display panel. The embodiment of the present invention provides a display panel, which comprises the mentioned above circuit board 2.

As another aspect of embodiments of the present invention, there is provided a liquid crystal display device comprising a circuit board 2 and a matching board 1 attached to the circuit board 2; the circuit board 2 is the above mentioned circuit board provided in any embodiment of the present invention.

It can be more accurate to judge the attaching state between the circuit board 2 and the matching board 1 by detecting the deformation state of the conductive particles in the vacant area 23b at different locations after the matching board 1 is attached to the circuit board 2, so that it can be accurately judged whether the liquid crystal display device is a good product or not.

The circuit board 2 can be a rigid circuit board, and accordingly, the matching board 1 can be a flexible printed circuit board. Specifically, the circuit board 2 can be referred to an external circuit pad area at the edge of the array substrate of a display panel, and the matching board 1 is a flexible printed circuit board which is attached to the circuit board 2.

What are described above is related to the illustrative embodiments of the disclosure only and not limitative to the scope of the disclosure; the scopes of the disclosure are defined by the accompanying claims.

The application claims priority to the Chinese patent application No. 201520411746.1, filed on Jun. 15, 2015, the entire disclosure of which is incorporated herein by reference as part of the present application.

What is claimed is:

1. A circuit board, comprising a first circuit pattern and an attaching state inspection area, wherein the first circuit pattern and the attaching state inspection area are located on different areas of the circuit board, wherein the attaching state inspection area includes a third circuit pattern, and wherein conductive particles are provided in an area of the attaching state inspection area in which the third circuit pattern is not provided, wherein the first circuit pattern comprises a plurality of first circuit sub-patterns extending in a first direction and arranged in a second direction, the third circuit pattern comprises a plurality of sub-sections distributed in the attaching state inspection area, at least two sub-sections of the plurality of sub-sections are arranged in the second direction, and, in the first direction, a size of at least one sub-section of the plurality of sub-sections is less than a size of one of the plurality of first circuit sub-patterns, the first circuit pattern and the third circuit pattern are arranged in the second direction, and the first circuit pattern and the third circuit pattern do not overlap in a direction perpendicular to the circuit board.

2. The circuit board according to claim 1, wherein a height and a material of the first circuit pattern are the same as a height and a material of the third circuit pattern.

3. The circuit board according to claim 1, wherein the sub-sections have no overlapping area with each other in a length direction of the attaching state inspection area, wherein the length direction is the first direction.

4. The circuit board according to claim 1, wherein one of the sub-sections has overlapping areas with other sub-sections in a length direction of the attaching state inspection area, wherein the length direction is the first direction.

5. The circuit board according to claim 1, wherein, the attaching state inspection area is a first attaching state inspection area, the circuit board further comprises a second attaching state inspection area, and wherein the first attaching state inspection area and the second attaching state inspection area are respectively positioned on either side of the first circuit pattern.

6. The circuit board according to claim 1, wherein the circuit board further comprises at least one circuit board alignment mark, and the at least one circuit board alignment mark includes at least two sub-alignment marks that are provided at an interval.

7. The circuit board according to claim 6, wherein a position, in a horizontal direction, of the circuit board alignment mark is entirely in a middle part of the attaching state inspection area.

8. The circuit board according to claim 7, wherein a height and a material of the circuit board alignment mark are the same as a height and a material of the first circuit pattern.

9. The circuit board according to claim 1, wherein the circuit board is configured for being attached to a matching board.

10. A circuit board assembly, comprising the circuit board according to claim 1 and a matching board, wherein the matching board includes a second circuit pattern.

11. The circuit board assembly according to claim 10, wherein the second circuit pattern comprises:
    a matching pattern matching with the first circuit pattern; and
    a detection pattern matching with the third circuit pattern in the attaching state inspection area.

12. The circuit board assembly according to claim 11, wherein the circuit board and the matching board are in a state in which they are attached and aligned to each other, wherein the detection pattern comprises a first portion configured to attach to the third circuit pattern and a second portion that does not overlap with the third circuit pattern, wherein the third circuit pattern is configured to define a position of the conductive particles, and the second portion is configured to detect a case where the conductive particles are pressed and deformed by the second portion to judge an attaching state of the circuit board and the matching board.

13. The circuit board assembly according to claim 11, wherein the detection pattern comprises at least one strip electrode, and wherein at least one sub-section of the plurality of sub-sections is parallel to the at least one strip electrode, and a size of at least one sub-section of the plurality of sub-sections is less than a size of the at least one strip electrode in an extending direction of the at least one strip electrode.

14. The circuit board according to claim 10, wherein the first circuit pattern of the circuit board is electrically connected with a circuit in the second circuit pattern of the matching board via the conductive particles.

15. A liquid crystal display device, comprising a matching board and a circuit board matching the matching board, wherein the circuit board is the circuit board according to claim 1.

16. The liquid crystal display device according to claim 15, wherein the matching board is a flexible printed circuit board.

17. The liquid crystal display device according to claim 15, wherein the matching board includes a second circuit pattern.

18. The liquid crystal display device according to claim 17, wherein the second circuit pattern comprises:
    a matching pattern matching the first circuit pattern; and
    a detection pattern matching the attaching state inspection area.

19. The circuit board according to claim 1, wherein the first circuit pattern is electrically insulated from the third circuit pattern.

* * * * *